(12) United States Patent
Hedler et al.

(10) Patent No.: US 7,919,868 B2
(45) Date of Patent: Apr. 5, 2011

(54) CARRIER SUBSTRATE AND INTEGRATED CIRCUIT

(75) Inventors: Harry Hedler, Germering (DE); Thorsten Meyer, Regensburg (DE)

(73) Assignees: Qimonda AG, Munich (DE); Infineon Technologies AG, Neubiberg (DE)

( * ) Notice: Subject to any disclaimer, the term of this patent is extended or adjusted under 35 U.S.C. 154(b) by 133 days.

(21) Appl. No.: 11/839,440

(22) Filed: Aug. 15, 2007

(65) Prior Publication Data

US 2009/0045512 A1 Feb. 19, 2009

(51) Int. Cl.
*H01L 23/48* (2006.01)

(52) U.S. Cl. ............ 257/774; 257/738; 257/E23.01; 257/E21.476

(58) Field of Classification Search .......... 257/774
See application file for complete search history.

(56) References Cited

U.S. PATENT DOCUMENTS

| | | | | |
|---|---|---|---|---|
| 5,940,729 A * | 8/1999 | Downes et al. | ......... | 438/613 |
| 6,255,741 B1 * | 7/2001 | Yoshihara et al. | ......... | 257/792 |
| 6,365,974 B1 * | 4/2002 | Abbott et al. | ......... | 257/774 |
| 6,596,395 B1 * | 7/2003 | Muramatsu | ......... | 428/402 |
| 2002/0171145 A1 * | 11/2002 | Higuchi et al. | ......... | 257/738 |
| 2004/0119168 A1 * | 6/2004 | Downey et al. | ......... | 257/774 |
| 2004/0262767 A1 * | 12/2004 | Matsuo | ......... | 257/758 |
| 2005/0010725 A1 * | 1/2005 | Eilert | ......... | 711/132 |
| 2005/0047062 A1 * | 3/2005 | Mido et al. | ......... | 361/523 |
| 2005/0215049 A1 * | 9/2005 | Horibe et al. | ......... | 438/622 |
| 2005/0224969 A1 * | 10/2005 | Wu | ......... | 257/737 |
| 2006/0097400 A1 * | 5/2006 | Cruz et al. | ......... | 257/774 |
| 2006/0237225 A1 * | 10/2006 | Kariya et al. | ......... | 174/260 |

OTHER PUBLICATIONS

Lingbo Zhu, et al., "Aligned Carbon Nanotubes for Electrical Interconnect and Thermal Management"; Proceedings of the IEEE 2005 Electronic Components and Technology Conference, vol. 1, pp. 44-50, May 31-Jun. 3, 2005.

* cited by examiner

*Primary Examiner* — N Drew Richards
*Assistant Examiner* — Mamadou Diallo
(74) *Attorney, Agent, or Firm* — Patterson & Sheridan, LLP

(57) ABSTRACT

A carrier substrate comprising a through contact connecting a first contact field on a top face of the carrier substrate to a second contact field on a bottom face of the carrier substrate and a substrate material being provided around the through contact.

19 Claims, 17 Drawing Sheets

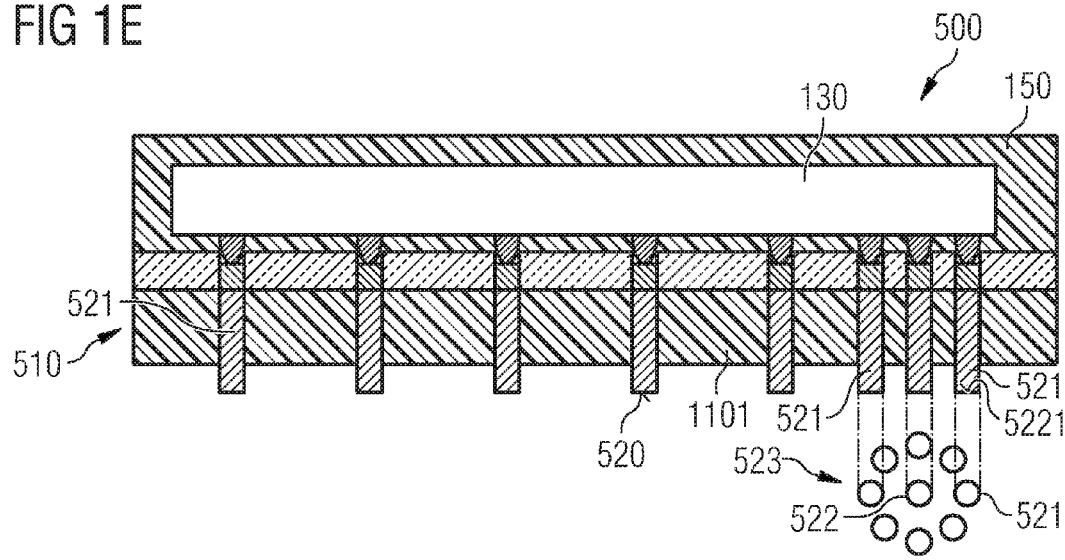
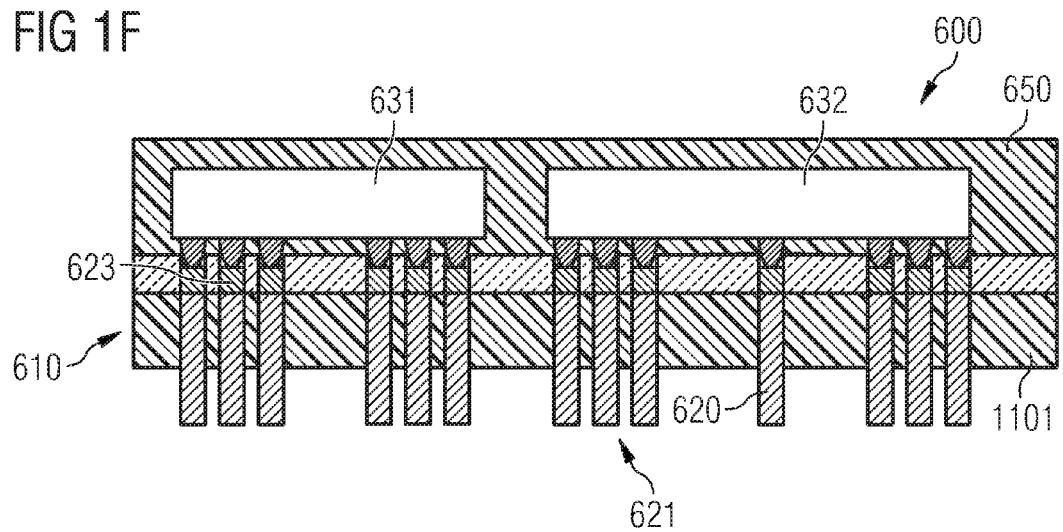

CARRIER SUBSTRATE AND INTEGRATED CIRCUIT

SUMMARY OF THE INVENTION

Embodiments of the invention generally provide articles of manufacture having through holes and methods of making the same.

In one embodiment, a carrier substrate comprises a through contact connecting a first contact field on a top face of the carrier substrate to a second contact field on a bottom face of the carrier substrate and a substrate material formed at least partially around the through contact.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A through 1H show schematic illustrations of integrated circuits according to embodiments of the present invention;

DETAILED DESCRIPTION OF THE PREFERRED EMBODIMENT

For one embodiment of the present invention a carrier substrate is provided, the carrier substrate comprising a through contact connecting a first contact field on a top face of the carrier substrate to a second contact field on a bottom face of the carrier substrate; and a layer of a substrate material being provided around the through contact.

For a further embodiment of the present invention an integrated circuit is provided, the integrated circuit comprising a carrier substrate comprising a through contact connecting a first contact field on a top face of the carrier substrate to a second contact field on a bottom face of the carrier substrate and a substrate material being provided around the through contact; a circuit chip comprising a further contact field; and a connection connecting the further contact field of the circuit chip to the first contact field of the carrier substrate.

For yet a further embodiment of the present invention a method of fabricating a carrier substrate is provided, the method comprising a providing of a through contact and a providing of a substrate material radially surrounding the through contact once the through contact is provided.

The features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit equally effective embodiments. In all figures, identical reference numbers identify identical or similar elements.

Figure 1A:
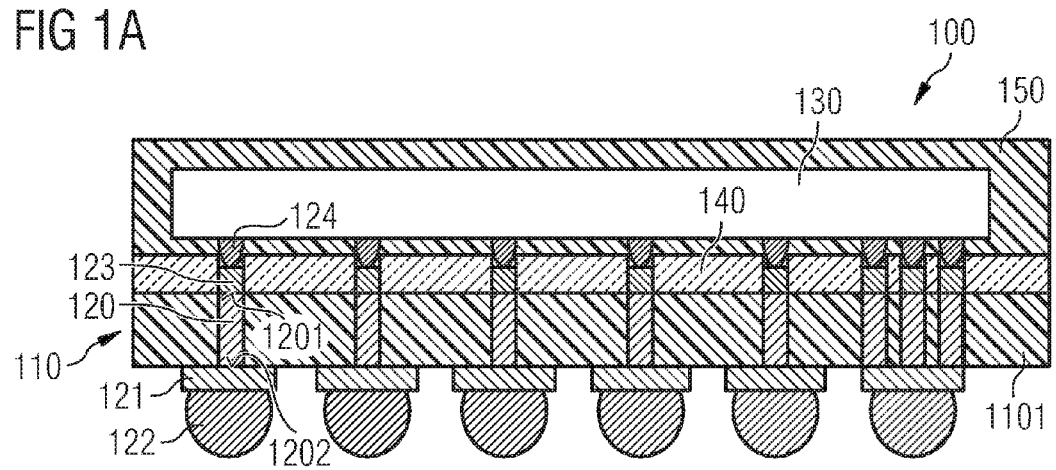

FIG. 1A shows an integrated circuit according to an embodiment of the present invention. The integrated circuit 100 comprises a carrier substrate 110, a circuit chip 130, and a package 150. The carrier substrate 110 comprises through contacts 120, connecting a first contact field 1201 on a top face of the carrier substrate 110 to a second contact field 1202 on a bottom face of the carrier substrate 110. On the top face of the carrier substrate 110 a contact layer 123 and a solder mask 140 are arranged. The contact layer 123 is connected by means of solder connections 124 to the circuit chip 130. On the bottom face of the carrier substrate 110 there are arranged contact pads 121, on which, in turn, there are arranged solder balls 122.

The carrier substrate 110, comprising the through contacts 120, may be formed according to an embodiment of the present invention. A substrate material 1101 has been provided around the through contacts 120. Suitable materials and combinations thereof of the substrate material 1101 comprise resins, metals, semiconductors, polymers, ceramics, and granular materials.

In the case the substrate material 1101 comprising a granular material, the granular material may be suspended in a resin or in a polymer, which are hardened after the provision around the through contacts 120. However, granular materials may also be sintered in order to form a solid and stable substrate material 1101. In such a case, an additional carrier material, such as a resin, may be rendered obsolete. Granular materials may include spheres, microspheres, nanospheres, cylinders, pillars, cubes, or grains, which may comprise semiconductor materials, dielectric materials, metals, insulators, and the like.

The substrate material 1101 may furthermore possess thermal and structural properties that allow, in conjunction with the material of the through contacts 120, a reduction or elimination of internal mechanical stress in order to avoid warpage of the carrier substrate 110. In addition, thermal properties, such as thermal expansion coefficients, of the constituent materials of the substrate material 1101 may be chosen such to allow also for a thermal stability of the carrier substrate 110. A suitable matching of the coefficient of thermal expansion (CTE) may furthermore allow for high density flip chip interconnects.

The circuit chip 130 may comprise an integrated device, a semiconductor substrate, a semiconductor chip, an integrated circuit chip, a memory chip, a central processing unit chip, a processor chip, a microchip, a logic chip, a signal processing chip, an analog and/or digital circuitry chip. The package 150 may comprise a package mold material, such as a resin or a polymer, and surround and/or encapsulate the circuit chip 130, such to protect the circuit chip 130 from mechanical, electrical, chemical and/or other environmental surroundings.

Figure 1B:
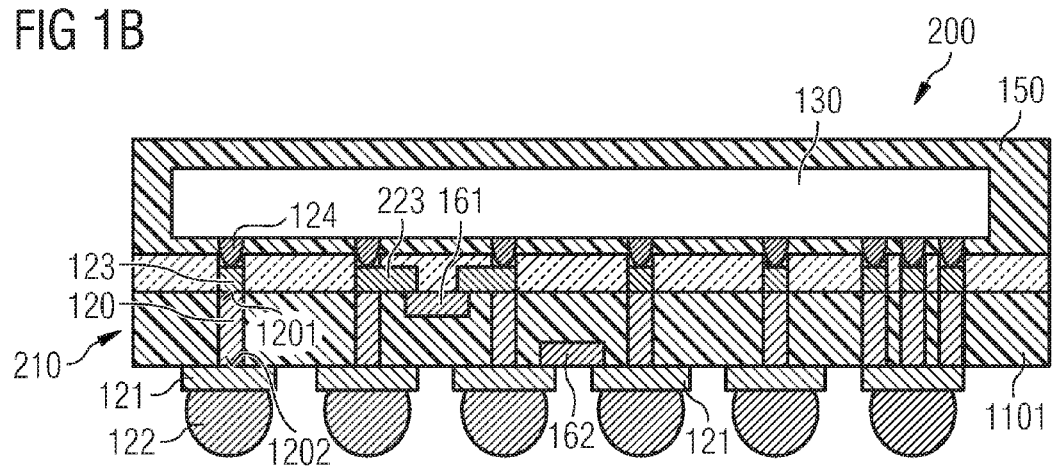

FIG. 1B shows a schematic view of an integrated circuit according to an embodiment of the present invention. The integrated circuit 200 comprises a carrier substrate 210, which comprises functional elements, such as a first functional element 161 and a second functional element 162. Functional elements may include active or passive components, such as a capacitor, an inductor, a resistor, a diode, a fuse, a filter, and/or a transistor. Further examples include light emitting diodes, semiconductor lasers, light sensors, light emitters, conductors, dielectrics, insulators, devices for the protection from electrostatic discharge events (ESD-protection), and/or integrated circuits.

Accordingly, a functional element may be arranged in the carrier substrate 210, for example, at a top surface, such as the first functional element 161. The first functional element 161 may be contacted to the circuit chip 130 and/or to a through contact 120 by means of respective signal lines 223 of the contact layer 123. Furthermore, a functional element may be arranged on a bottom face of the carrier substrate 210, such as the second functional element 162. In such a case, for example, the second functional element 162 may be connected to the circuit substrate 130, to the through contacts 120, or to the solder balls 122 by means of the contact pads 120. For such a case, the contact pads 120 may be extended such to connect to a functional element, such as the second functional element 162. However, a functional element may also be arranged inside the carrier substrate, hence completely encapsulated by it.

Figure 1C:
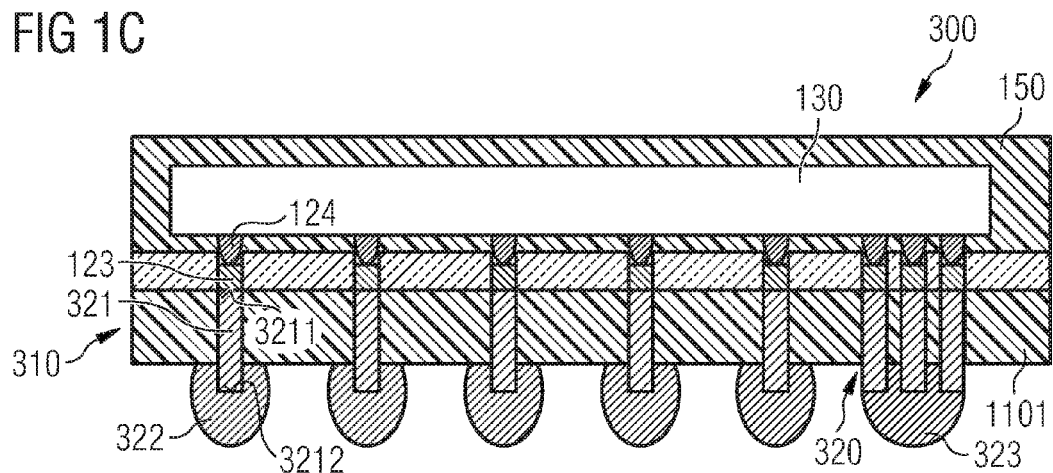

FIG. 1C shows an integrated circuit according to an embodiment of the present invention. The integrated circuit 300 comprises a carrier substrate 310 which may be formed according to an embodiment of the present invention. The carrier substrate 310 comprises through contacts 321 and/or groups 320 of through contacts 321. A group 320 of through contacts 321 may provide a connection of several points of the contact layer 123, may provide an increased conductivity, may provide the conduction of an increased current, may provide a decreased resistance, and/or may provide a given and well defined impedance for high-frequency signals, or a waveguide. The through contacts 321 comprise a first contact field 3211 on a top face of the carrier substrate 310, which are coupled via the contact layer 123 to the circuit chip 130.

According to this embodiment, the through contacts 321 extend from a bottom face of the carrier substrate 310 and comprise a second contact field 3212 in the area of the extending end of the through contact 321. Solder balls 322 are arranged on the bottom face of the carrier substrate 310 and are coupled to the through contacts 321. The material of the solder balls 322 may be soldered to the through contacts 321 in the area of the second contact field 3212. The through contacts 321 may further provide a surface being adjacent to the material of the solder ball 322 which may be wet by the material of the solder ball 322. Furthermore, a coating of the through contacts 321, at least in a part of the area of the second contact field 3212, may provide such a wetting. Also, the through contact 321 may comprise the material of the solder ball 322, in order to allow for a good and stable electrical connection. A second type of a solder ball 323, may provide a connection to a group 320 of through contacts 321. For this purpose, the solder ball 323 may be larger in size and/or footprint than the solder balls 322.

Figure 1D:
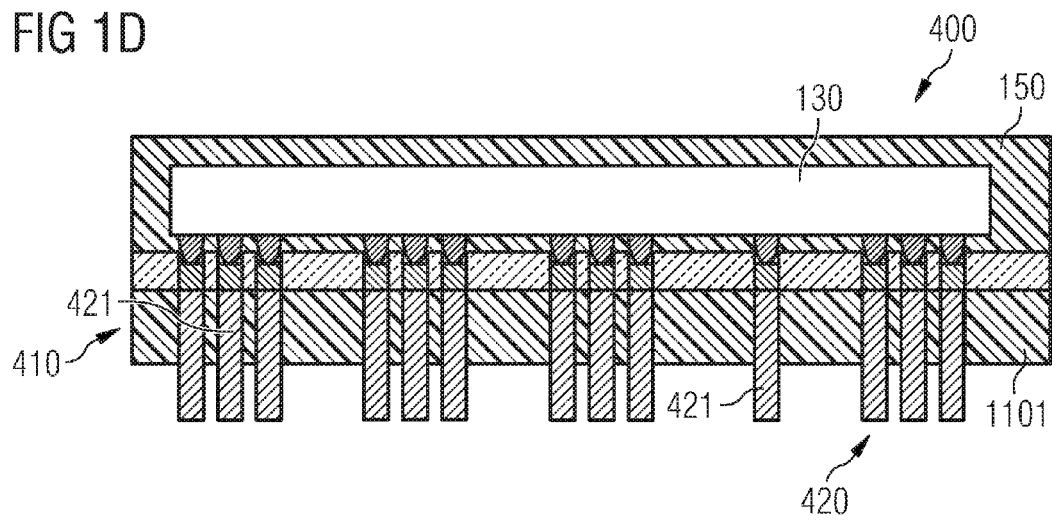

FIG. 1D shows an integrated circuit according to an embodiment of the present invention. The integrated circuit 400 comprises a carrier substrate 410 which may be formed by an embodiment of the present invention. The carrier substrate 410 comprises through contacts 421 and/or groups 420 of through contacts 421. According to this embodiment, the integrated circuit 400 may be connected to other circuitry, such as a printed circuit board, by means of soldering the extending lower ends of the through contacts 421 to respective contact pads.

Furthermore, the extending ends of the through contacts 421 may be connected mechanically to other circuitry. Examples for mechanical contacts may comprise inserting the extending ends of the through contacts 421 into respective eyelets and/or holes. The extending ends of the through contacts 421 may be a part of a pin grid array (PGA). The extension of the extending parts of the through contacts 421 may be in arrange of 20 µm to 50 µm. In addition to this, the extending ends of the through contacts 421 may be welded, soldered, and/or glued to an external circuitry. Applicable soldering techniques may include wave soldering, infrared soldering, reflow soldering. Applicable welding techniques may include laser welding and/or ultrasonic welding.

FIG. 1E shows an integrated circuit according to an embodiment of the present invention. The integrated circuit 500 comprises a carrier substrate 510, in which there are arranged through contacts 520. Through contacts may be arranged as a group 523, the group 523 comprising surrounding through contacts 521 and at least a center through contact 522. The surrounding through contacts 521 may be coupled to a common potential, such as a reference potential and/or a ground potential. The center through contact 522 may conduct a high-frequency signal and/or an electromagnetic wave at a frequency, which may determine the radius and/or the distance of the surrounding through contacts 521, the diameter of a through contacts 521, 522, and/or dielectric properties of the mold material of the carrier substrate 510. Respective contact fields 5221 may then be connected in such a coaxial configuration to a further circuitry.

FIG. 1F shows an integrated circuit according to an embodiment of the present invention. According to this embodiment, an integrated circuit 600 comprises more than one circuit chip, such as a first circuit chip 631 and a second circuit chip 632. The first circuit chip 631 and the second circuit chip 632 may be encapsulated by a single integrated circuit package, which may include a package mold material 650. The carrier substrate 610 may comprise through contacts 620 and/or groups 621 of through contacts 620. A contact layer 623, being arranged on a top face of the carrier substrate 610 may provide connections from the circuit chips 631, 632 to the respective through contacts 620. The contact layer 622 may furthermore comprise signal lines, which connect parts of the first circuit chip 631 to parts of the second circuit chip 632.

Figure 1G:
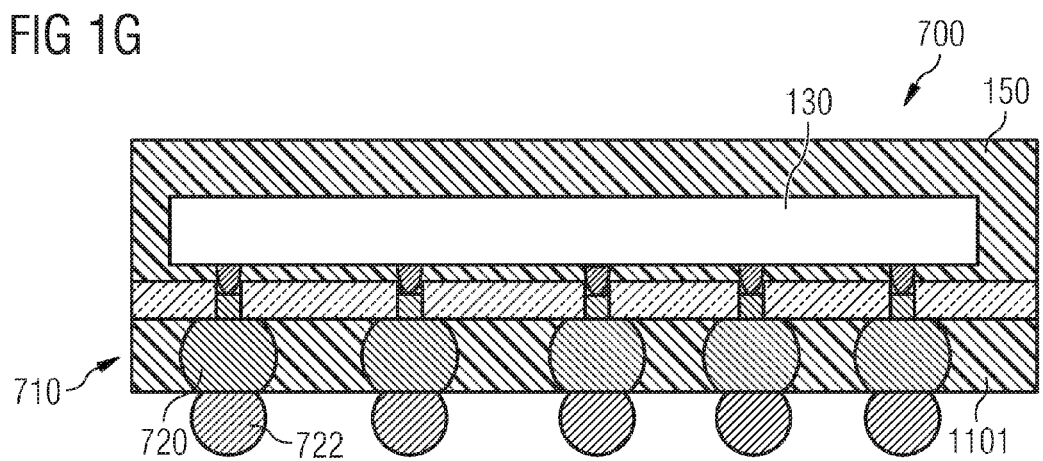

FIG. 1G shows an integrated circuit according to an embodiment of the present invention. The integrated circuit 700 comprises a carrier substrate 710 which may be formed by an embodiment of the present invention. Accordingly the carrier substrate 710 comprises through contacts 720, which may comprise balls, spheres, truncated or flattened spheres, and/or other conductive elements. Such elements may include metal spheres, solder balls, semiconductor spheres, microspheres, studs, pillars, cubes, grains, and the like. The substrate material 1101 is provided around the through contacts 720 and, hence, the through contacts 720 are embedded in the substrate material 1101.

According to this embodiment, solder balls 722 are arranged on a bottom face of the carrier substrate 710. The material of the solder balls 722 may comprise a solder metal which melts at a first temperature, whereas the through contacts 720 may comprise a conductive material, such as a metal, which melts at a second temperature, wherein the second temperature is higher than the first temperature. In this way, the solder ball 722 may be liquefied in order to form a solder connection, whereas the ball 720 may still remain solid during such a process. This may inhibit a liquefaction of the through contact 720 and may hence prevent an expulsion of the material of the through contact 720 from the respective cave of the carrier substrate 710. Such an expulsion may be induced by, for example, a surface tension force of a melted material of the through contact 720.

Figure 1H:
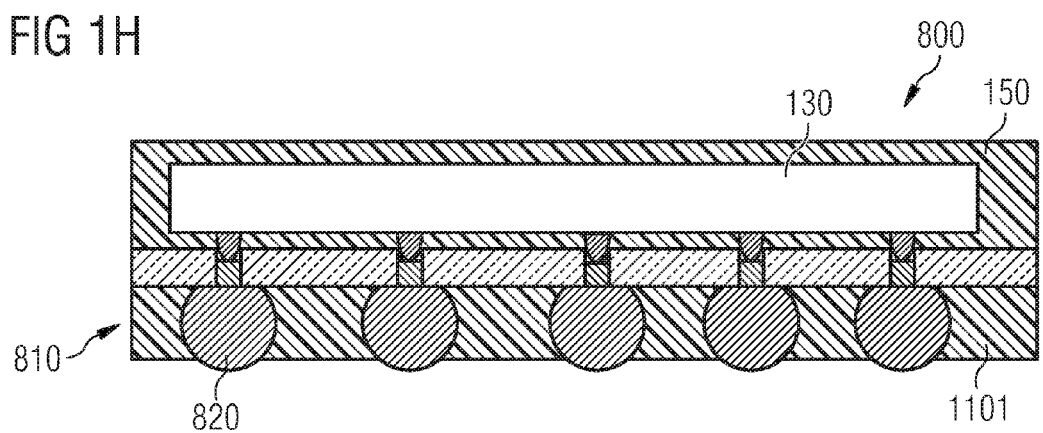

FIG. 1H shows an integrated circuit according to an embodiment of the present invention. The integrated circuit 800 comprises a carrier substrate 810, being formed by an embodiment of the present invention. The carrier substrate 810 comprises through contacts 820, which may be comprise singly truncated or flattened spheres. Such a flat may be arranged toward a top face of the carrier substrate 810 for an appropriate interconnection to a circuit chip 130 via a contact layer 840.

The through contact 820, for example being provided as a singly truncated sphere, may extend from a bottom face of the carrier substrate 810. In this way, the through contacts 820 may establish a mechanical contact to elements of a further circuitry, such as a contact pad of a printed circuit board (PCB). The through contacts 820 may comprise a solder material, which may be soldered to respective contact pads of an external circuitry, for example, to contact pads of a printed circuit board. An opening of the carrier substrate 810 at the bottom face of the carrier substrate 810 through which the through contact 820 extends may provide an appropriate aperture, this in respect to size and shape, such to prevent the material of the through contact 820 to be expelled from the respective cave of the carrier substrate 810 upon liquefaction, for example, during a soldering process.

Figure 2A:
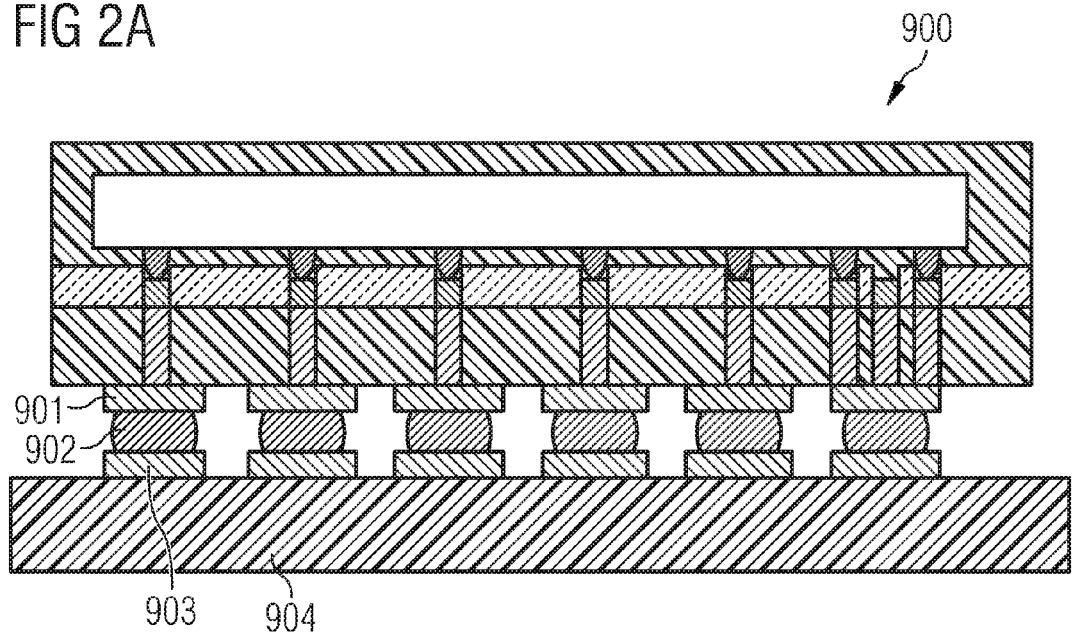
FIGS. 2A through 2D show schematic illustrations of integrated circuits in conjunction with circuit boards according to embodiments of the present invention.

FIG. 2A shows an arrangement of an integrated circuit and a circuit board according to an embodiment of the present invention. Accordingly, an integrated circuit 900, such as an integrated circuit which has been described in conjunction with an embodiment of the present invention, is soldered to a circuit board 904. The integrated circuit 900 comprises contact pads 901 on a bottom face of the integrated circuit 900. The circuit board 904 comprises respective contact pads 903 on a top face of the printed circuit board 904, facing the bottom face of the integrated circuit 900. The arrangement and size of the contact pads 901, 903, may be such that the contact pads 901 of the integrated circuit 900, at least in part, overlap with the contact pads 903 of the printed circuit board 904.

The contact pads 901 are connected by means of solder connections 902 to the respective contact pads 903. The solder connections 902 may be formed by a melted and soldered solder ball, which has been placed either onto the contact pad 901 or to the contact pad 903 prior to a soldering process. Furthermore, the solder connection 902 may be formed by a solder paste, which has been provided on a bottom face of the integrated circuit 900 or on the top face of the printed circuit board 904 prior to the soldering process.

Figure 2B:
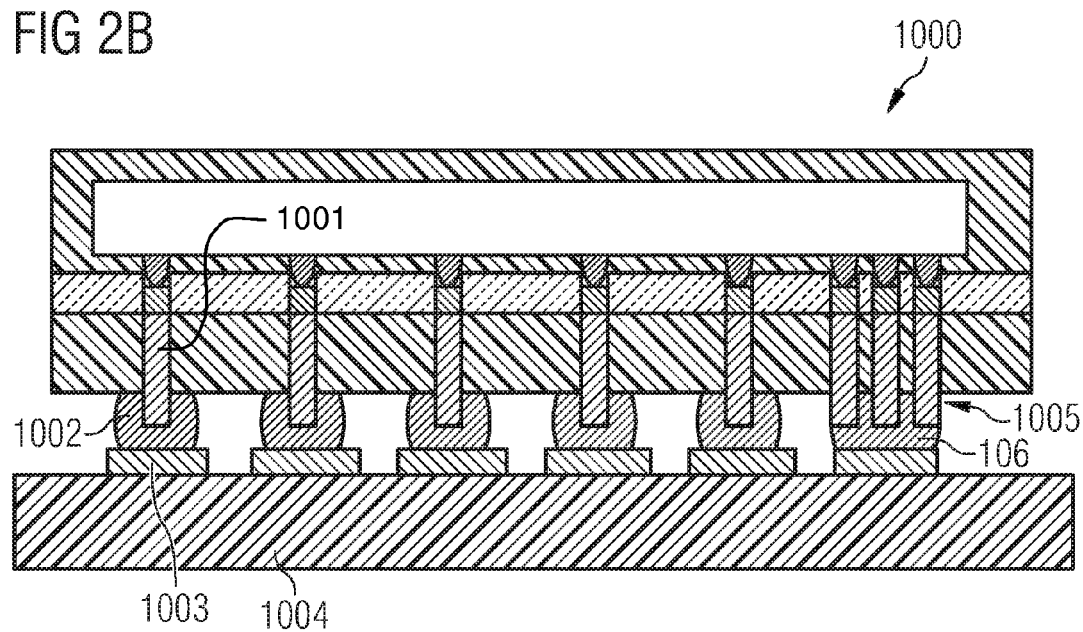

FIG. 2B shows a schematic view of an arrangement comprising an integrated circuit and a printed circuit board according to an embodiment of the present invention. An integrated circuit 1000, being, for example one of the integrated circuits as they are described in conjunction with an embodiment of the present invention, comprises through contacts 1001 which extend from a bottom face of the integrated circuit 1000. The extending through contacts 1001 are connected to contact pads 1003 of a circuit board 1004 by means of solder connections 1002. The solder connections 1002 may connect an individual through contact, such as a through contact 1001, or a group 1005 of through contacts 1001. In this case the respective solder connection 1006 may comprise more solder material and may connect all or a part of the through contacts 1001 of the group 1005 of through contacts to one or more contact pads 1003 of the circuit board 1004.

Figure 2C:
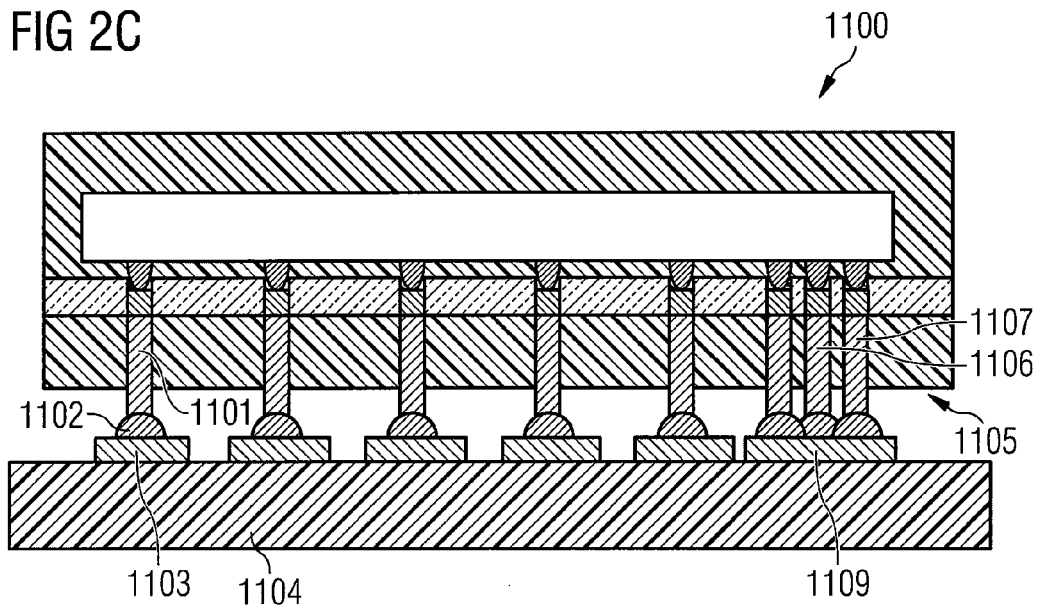

FIG. 2C shows a schematic view of an arrangement comprising an integrated circuit and a printed circuit board according to an embodiment of the present invention. The integrated circuit 1100 comprises a group 1105 of through contacts, which are arranged as surrounding through contacts 1107 around a center through contact 1106. The printed circuit board 1104 may comprise a respective contact pad 1109 which connects to the individual through contacts of the group 1105 of the through contacts. This contact pad 1109 may be of circular shape, since the center through contact 1106 may be connected to a signal line, whereas the surrounding through contacts 1107 of the group 1105 may be connected to a common potential, such as a reference potential or a ground potential. Such a coaxial configuration may allow for a well-defined impedance of a through contact in a carrier substrate, and may provide improved transmittance characteristics for high frequency signals and/or electromagnetic waves.

Figure 2D:
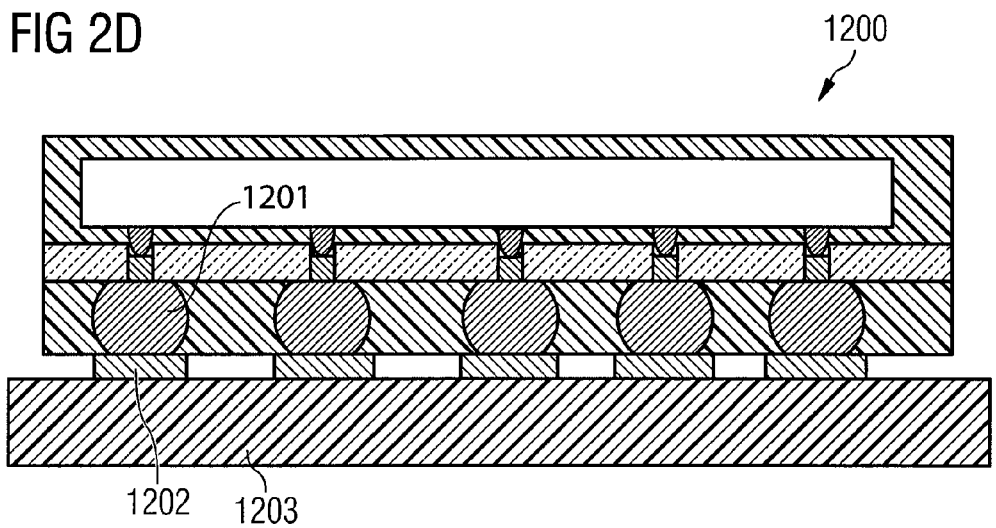

FIG. 2D shows an arrangement with an integrated circuit and a circuit board according to an embodiment of the present invention. Accordingly, the integrated circuit 1200 comprises through contacts 1201 which may comprise spheres and/or truncated spheres. The through contacts 1201 may further comprise a solder material. According to this embodiment, the through contacts 1201 may be soldered directly to contact pads 1202 of the circuit board 1203, and may, hence, provide a through contact through a carrier substrate and a solder contact to an external circuitry or printed circuit board simultaneously.

Figure 3A:
FIGS. 3A through 3H show schematic illustrations of an integrated circuit in various stages during manufacturing according to an embodiment of the present invention.

FIGS. 3A through 3H show schematic views of an integrated circuit in various stages during manufacturing according to an embodiment of the present invention. As FIG. 3A shows, a first contact layer 30 is provided. The first contact layer 30 may comprise conductive material, such as copper, aluminum, gold, iron, chromium, cobalt, manganese, FeCrCo, FeMn, and the like. The contact layer 30 may be provided by a sheet metal, a deposited metal film or layer, or a tape on frame. A thickness of the contact layer 30 may be in a range of 5 to 150 µm. The first contact layer 30 may furthermore be arranged on a process carrier, which may provide mechanical stability and handling ease during processing.

Figure 3B:
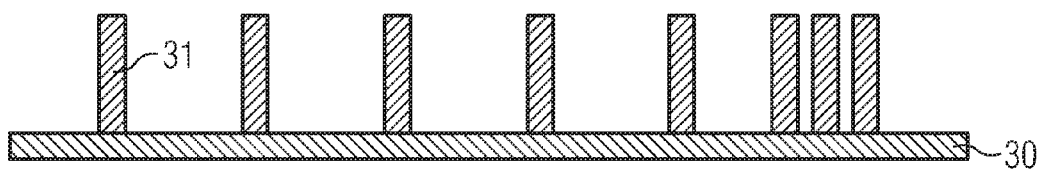

As shown in FIG. 3B, through contacts 31 are provided on the first contact layer 30. The through contacts 31 may be arranged essentially perpendicular to the contact layer 30. The individual through contacts 31 may be arranged parallel to each other, for example, providing a median angle below one degree, below half a degree, or below 0.1 degree. The median angle may be defined as the median of the angles being enclosed by two neighboring through contacts 31. Such a median angle may be a figure of merit in respect to the parallelism of the through contacts 31. In such a way, through contacts 31 may be provided with a high density and a high pin count.

The through contacts 31 may comprise a bond wire, a stud bond, semiconductor pillars, metal pillars, and the like. In the case of the through contacts 31 comprising bond wires, the bond wires may be bonded to the first contact layer 30 at respective positions, may be lead upwards vertically to the first contact layer 30, and may be cut at a well defined length. A diameter of such wires may be in arrange of 15 µm to 150 µm. The length of all through contacts 31 may be such that a minimum length of the through contacts 31 is maintained. A median length of the through contacts 31 may be in arrange of 75 µm to 650 µm. Furthermore, the through contacts 31 may be grown by means of a deposition technique. In such a case, deposition seeds may be placed on the contact layer 30 or onto any base, the position of such seeds determining the position of a grown through contact 31.

Figure 3C:
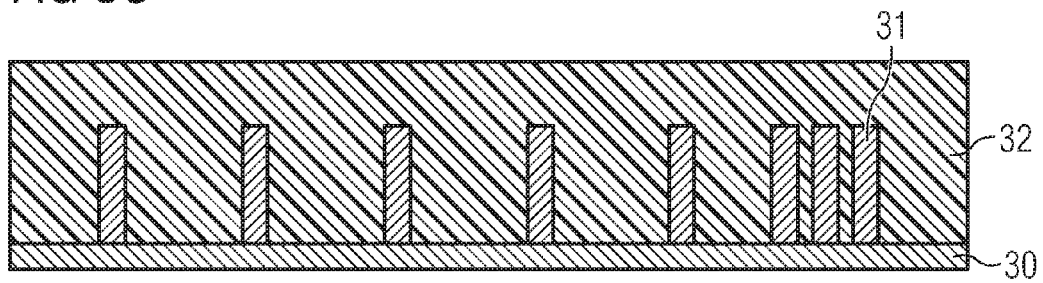

As shown in FIG. 3C, a substrate material 32 is provided on the first contact layer 30 and around the through contacts 31, such that the through contacts 31 are surrounded by the substrate material 32, at least up to the minimum length. The substrate material 32 may furthermore entirely cover the through contacts 31 in this stage during manufacturing. The substrate material 32 may comprise a resin, a polymer, polyimide, epoxy resin, a mold compound, a ceramic, a semiconductor, a metal, an insulator, a dielectric, and/or a combination thereof. For example, the substrate material 32 may comprise granular silicon or silicon spheres which may be suspended in a resin. As a further example, a polymer and/or a resin with silicon grains or spheres, wherein the silicon content is above 50% by weight, above 75% by weight, or above 90% by weight. The median diameter of the granular units of a granular material may be matched to pitch and/or distance between neighboring through contacts 31.

In the case that the substrate material 32 is provided in a liquid state, the liquid substrate material 32 may be cast around the through contacts 31 and may subsequently solidified. A liquid state may include a partially liquid state, wherein, for example, a solid granular material is suspended in a liquid resin. Solidification may be effected by a polymerization of a resin, which may be supported by a thermal treatment. A solidification may also be effected by a cooling of a molten liquid substrate material 32 below a melting temperature. In general, a viscous state of the substrate material 32 may characterize the possibility of casting the substrate material 32 around the through contacts 31. A viscous state may include a liquid state, a gaseous state, a granular state, and/or a vapor phase state.

However, the substrate material 32 may also be provided on the first contact layer 30 and around the through contacts 31 in a solid state or in a gaseous or vapor state. Examples include in this case the common deposition techniques, such as physical vapor deposition (PVD), chemical vapor deposition (CVD), and thermal deposition, the latter involving a condensation of a gaseous or vaporized material on the first contact layer 30 and around the through contacts 31.

Figure 3D:
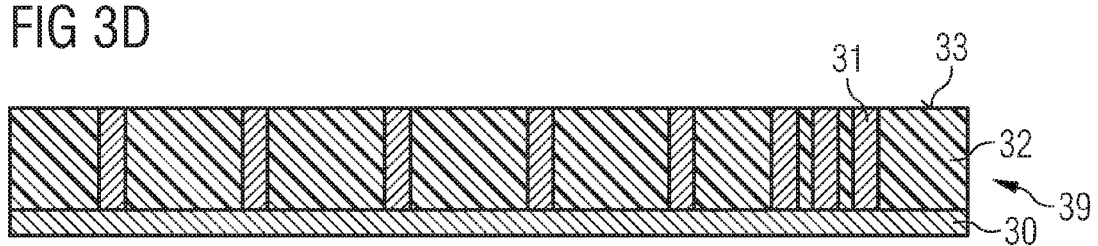

As shown in FIG. 3D, the substrate material 32 is flattened from a top face until the through contacts 31 are exposed. The flattening may involve a flattening of the through contacts 31 as well, such to provide a carrier substrate 39 with a well defined height and a reliable exposure and/or functionality of all through contacts 31. The flattening may be effected by means of, for example, polishing, grinding, or chemical-mechanical polishing (CMP).

Figure 3E:
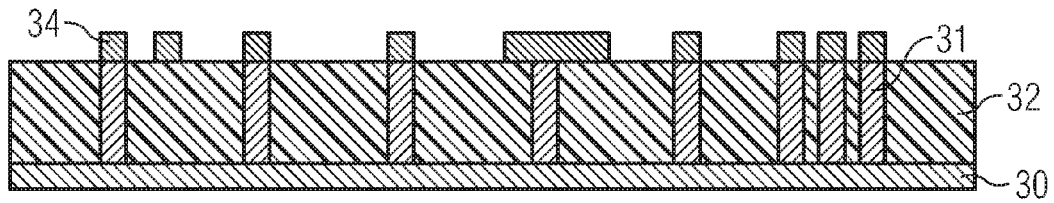

As shown in FIG. 3E, a second contact layer 34 is provided on the top face of the carrier substrate 10. The contact layer 34 may be first provided as a continuous layer and then subsequently being patterned or structured, such that signal lines and/or contact pads are provided on the top face of the carrier substrate 10, those signal lines and contact pads being coupled to respective through contacts 31. Suitable materials for the second contact layer 34 include copper, nickel, gold, and/or combinations thereof.

The top face of the carrier substrate 10 may provide a sufficient flatness in order to allow for high density redistribution of signals, wherein a line width may be below 50 µm, below 15 µm, or below 10 µm. Such a narrow line width may provide improved signal transmission for ac signals, for example, above 500 MHz, or above 1 GHz. For multi-level redistribution, more than one contact layer 34 and intermediate insulating layers may be provided. A single contact layer 34 may be provided as well as more than one contact layer and/or insulating layers for a multi-level redistribution.

Figure 3F:
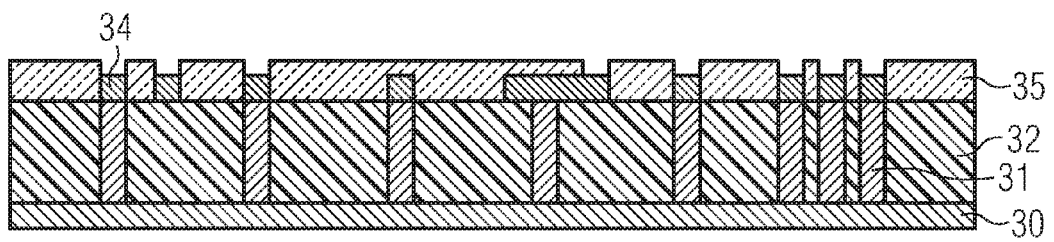

As shown in FIG. 3F, a solder mask 35 is provided on the carrier substrate 32 and on the second contact layer 34. The solder mask 35 may comprise openings such to expose parts of the contact layer 34. Furthermore, the solder mask 35 may provide a greater thickness than the contact layer 34, such to provide an insulation of parts of the contact layer 34. In this way, the contact layer 34 may act as a redistribution layer and/or may comprise signal lines for rerouting signals from one position on a plane of the carrier substrate 32 to another position.

Figure 3G:
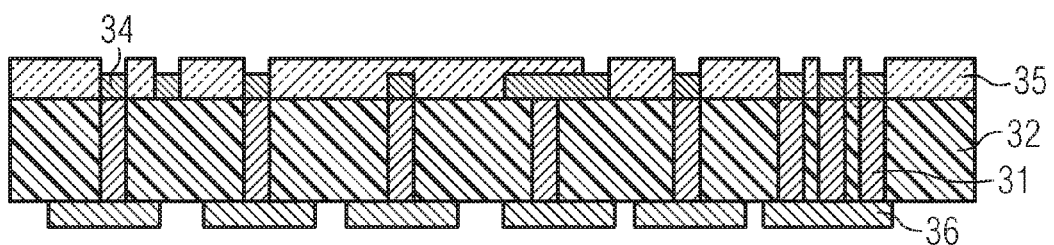

As shown in FIG. 3G, the first contact layer 30 on the bottom face of the carrier substrate 32 is patterned such to provide contact pads 36. One contact pad 36 may be coupled to a single through contact 31, more than one through contact 31, or to a group of through contacts 31.

Figure 3H:
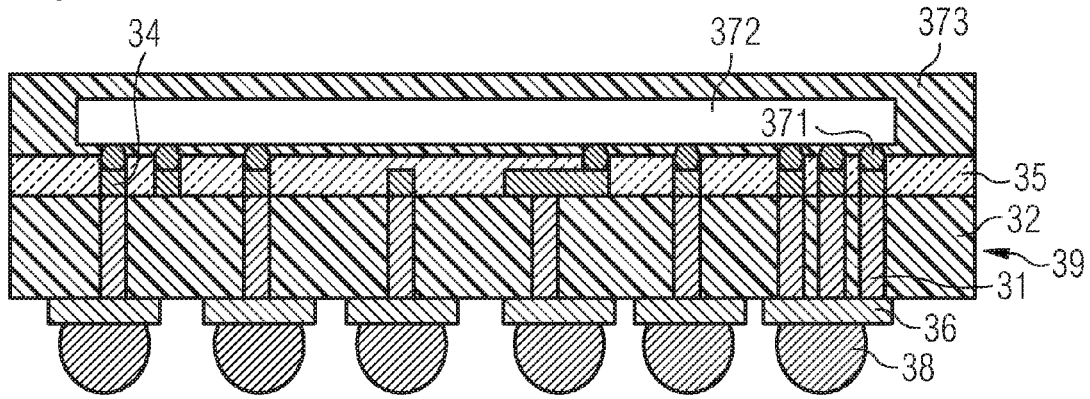

As shown in FIG. 3H, which illustrates a ready integrated circuit, a circuit chip 372 is arranged on the carrier substrate 39 and coupled to the through contacts 31 of the carrier substrate 39. The coupling may be effected by means of the contact layer 34 and solder connections 371. The solder connections 371 may be formed by solder balls which may have been arranged on the second contact layer 34 or on the circuit chip 372 prior to a soldering process. The solder connections 371 may be arranged in respective openings of the solder mask 35. Furthermore, one or more circuit chips 372 may be arranged on the carrier substrate 39 such to provide a multichip package (MCP) integrated circuit, a multi-chip module (MCM), a system in package (SiP), or an integrated circuit with a chip stack. In such a way, the carrier substrate may provide a connection of a memory chip and a processor chip, such as a RAM/DRAM-core and a processor-core.

The circuit chip 371 and/or the solder mask 35 and/or other elements of the integrated circuit may be surrounded by a package 373, such to provide a packaged and encapsulated integrated circuit. Furthermore, solder balls 38 are arranged on the contact pads 36 on the bottom face of the carrier substrate 39, such to provide means for an electrical connection of the ready integrated circuit to an external circuitry, such as a computer system, a circuit system, a memory module, and/or a printed circuit board. Such solder balls 38 may be part of a ball grid array (BGA).

The thermal properties, such as the coefficient of thermal expansion (CTE), of the constituent materials of the carrier substrate 39 may be matched to the thermal properties of the circuit chip 371. In this way, a reliable and lasting interconnection of the carrier substrate 39 and the circuit chip 371 may be provided, which may, in turn, provide an improved reliability of the integrated circuit.

According to an embodiment of the present invention, more than one circuit chip may be coupled to a carrier substrate. This for the purpose of forming integrated circuits comprising more than one circuit chip or to form more than one integrated circuits simultaneously. In the latter case, circuit chips or groups thereof are coupled to one carrier substrate, which may be later singularized in order to provide multiple integrated circuits.

Figure 4A:
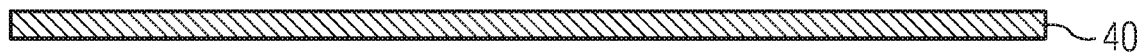
FIGS. 4A through 4F show schematic illustrations of an integrated circuit in various stages during manufacturing according to an embodiment of the present invention.
Figure 4B:
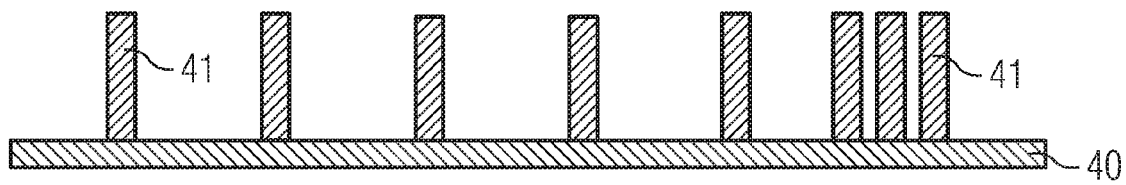

FIGS. 4A through 4F show schematic views of an integrated circuit in various stages during manufacturing according to an embodiment of the present invention. As FIGS. 4A and 4B show, a first contact layer 40 is provided and through contacts 41 are provided on the first contact layer 40. The first contact layer 40 and the through contacts 41 may be similar or identical to the first contact layer 30 and the through contacts 31, respectively, which have been described in conjunction with FIGS. 3A and 3B.

Figure 4C:
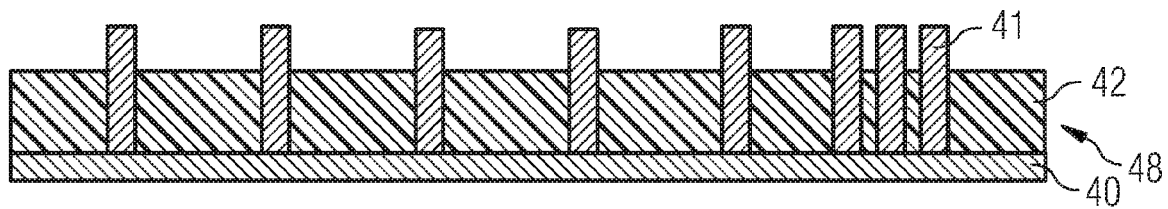

As shown in FIG. 4C, a substrate material 42 is provided on the first contact layer 40 and around the through contacts 41, such that the through contacts 41 are surrounded by the substrate material 42. According to this embodiment, the substrate material 42 is provided such that the through contacts 41 are still accessible or even extend from the substrate material 42. The accessible areas of the through contacts 41 and/or the extending ends thereof may hence serve as a contact field for further connection. Furthermore, a flatting process may be rendered obsolete which may contribute to a simplification of the overall manufacturing process. The substrate material 42 may be similar or identical to the substrate material 32, which has been described in conjunction with FIG. 3C.

Figure 4D:
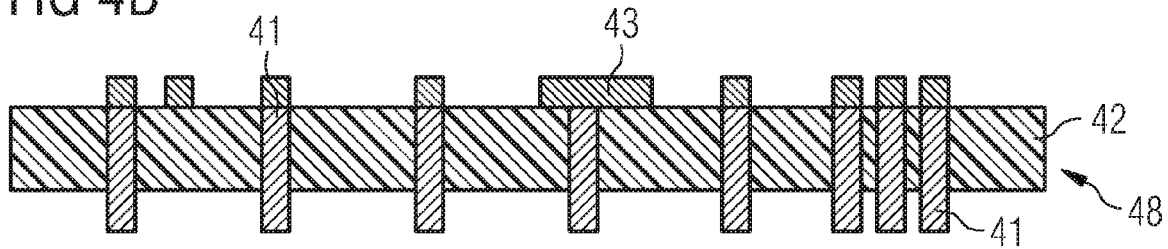

As shown in FIG. 4D, the carrier substrate 48 has been flipped upside down and is shown as such from FIG. 4D onwards. Hence, the face of the carrier substrate 48 on which the first contact layer 40 is arranged is referred to as the top face of the carrier substrate 48. Furthermore, the contact layer 40 is patterned, such to provide contact pads 48 and/or signal lines 43 on the top face of the carrier substrate 48. The signal lines 43 may provide a redistribution of signals on the top face of the carrier substrate 48.

Figure 4E:
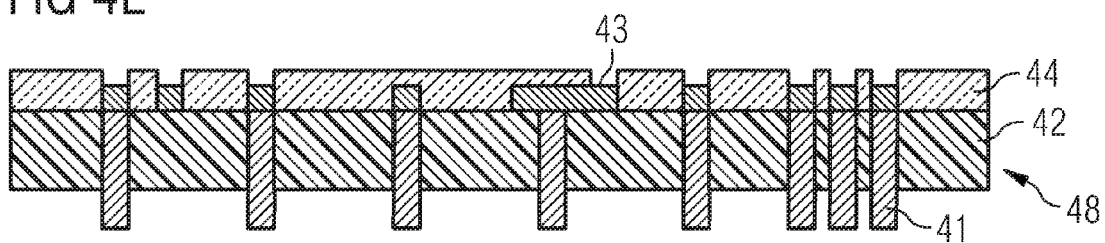

As shown in FIG. 4E, a solder mask 44 is arranged on the top face of the carrier substrate 48, such to provide a soldering mask and/or, at least in part, an insulation of the signal lines 43. The through contacts 41 are accessible from the bottom face of the carrier substrate 48 or extend from the bottom face of the carrier substrate 48.

Figure 4F:
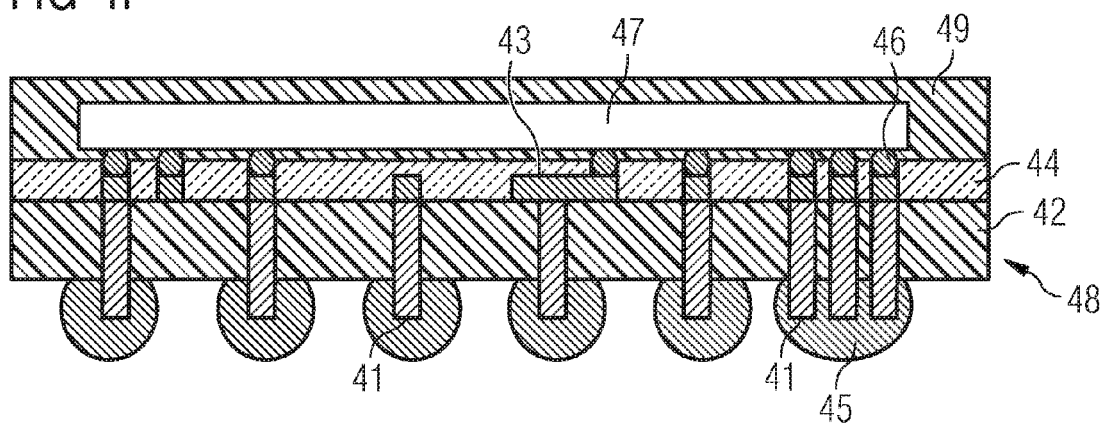

As shown in FIG. 4F, a circuit chip 47 is connected by means of solder connections 46 to the contact pads 48 and/or to the signal lines 43. Furthermore solder balls 45 are arranged on the bottom face of the carrier substrate 48 such to be soldered to the extending ends of the through contacts 41. One solder ball may be arranged around one through contact 41, as well as one solder ball may be arranged around more than one through contact 41 or around a group of through contacts 41. The material of the solder balls 45 may wet the through contacts 41 in the area of the contact field and hence may be soldered directly to the through contacts 4. An interstitial coating or wetting material may be arranged between the solder of the solder balls 41 and the through contacts 41 in order to promote or allow for a solder connection. The circuit chip 47 and/or the solder mask 44 and/or other elements of the integrated circuit may be surrounded, at least in part, by a package 49, such to provide a packaged and encapsulated integrated circuit.

Figure 5A:
FIGS. 5A through 5G show schematic illustrations of an integrated circuit in various stages during manufacturing according to an embodiment of the present invention.

FIGS. 5A through 5G show an integrated circuit in various stages during manufacturing according to an embodiment of the present invention. As shown in FIG. 5A a base layer 50 is provided. The base layer 50 may comprise an adhesive material and/or an elastic material, such as rubber, a polymer, silicone, and/or an adhesive. Furthermore, the base layer 50 may comprise an adhesive tape on a glass substrate.

Figure 5B:
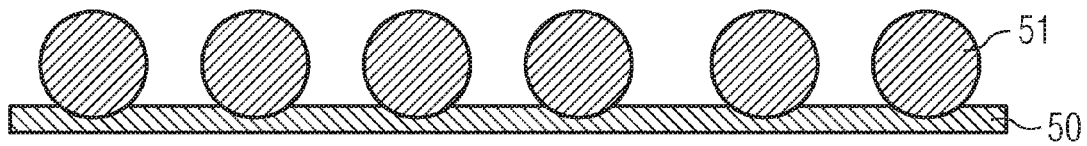

As shown in FIG. 5B, through contacts 51 are provided on the base layer 50. The through contacts 51 may comprise any suitable units comprising a conductive material, such unit including spheres, balls, cylinders, pillars, cubes, grains, and/or other geometrical structures. Conductive materials include metals, gold, copper, aluminum, solder, tin, silver, lead, bismuth, semiconductors, doped semiconductors, and/or amorphous semiconductors. Further examples include solder balls, metal microspheres, silicon microspheres, metal studs, metal pillars, semiconductor studs.

Figure 5C:
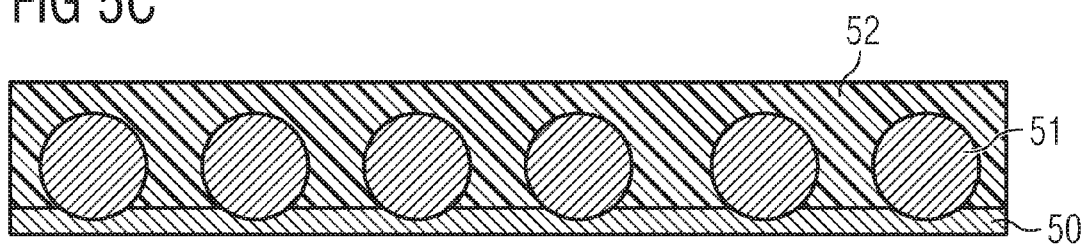

As shown in FIG. 5C, a substrate material 52 is provided on the base layer 50 and around the through contacts 51, such that the through contacts 51 are surrounded by the substrate material 52. The substrate material 52 is provided such that either the through contacts 51 are still accessible or even extend from the substrate material 52, or that the through contacts 51 are entirely covered by the substrate material 52. The substrate material 52 may be similar or identical to the substrate material 32, which has been described in conjunction with FIG. 3C.

Figure 5D:
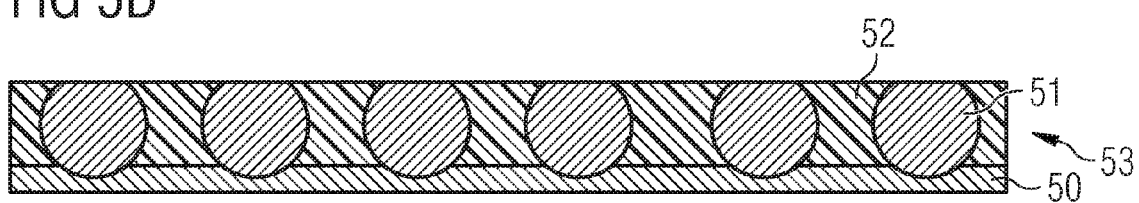

As shown in FIG. 5D, the substrate material 52, is flattened from a top face, such that the through contacts 51 are exposed. This may include a truncating of the through contacts 51 such to provide contact fields on a top face of the carrier substrate 53. However, similar to the arrangement which has been described in conjunction with FIG. 4C, the flattening may be rendered obsolete, if the substrate material 52 is provided on the base layer 50 and around the through contacts 51 such that the through contacts 51 are still accessible or even extend from the substrate material 52. In this way, a direct connection of the carrier substrate 53 to a further circuitry may be possible.

Figure 5E:
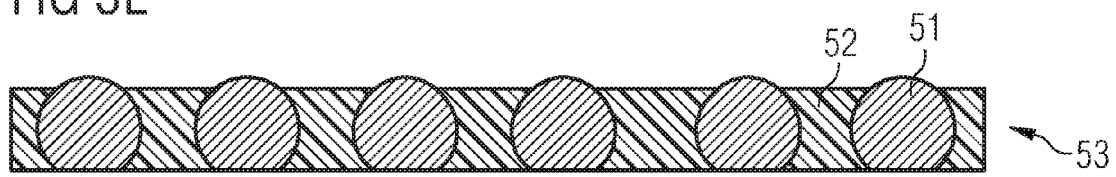

As shown in FIG. 5E, the carrier substrate 53 is flipped upside down such that the flattened face becomes a bottom face. The planar contact fields in which the through contacts 51 are exposed or accessible are arranged on the bottom face of the carrier substrate 53. On a top face of the carrier substrate 53 the through contacts 51 may extend from the top face, and may, as well, be flattened and/or ground in order to provide a planar surface. The base layer 50 may be removed from the carrier substrate 53 prior to the provision of a contact layer 54 and/or a solder mask 55.

Figure 5F:
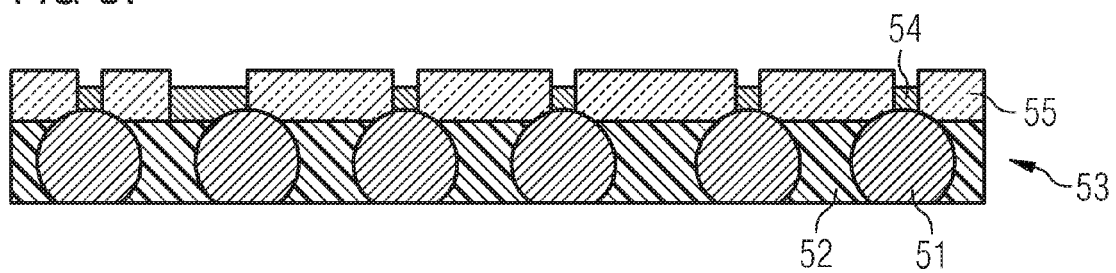

As shown in FIG. 5F a contact layer 54 and a solder mask 55 are provided on the top face of the carrier substrate 53. The contact layer 54 may provide contacting, contact pads, signal lines, and/or a rerouting of the electrical connections to the through contacts 51.

Figure 5G:
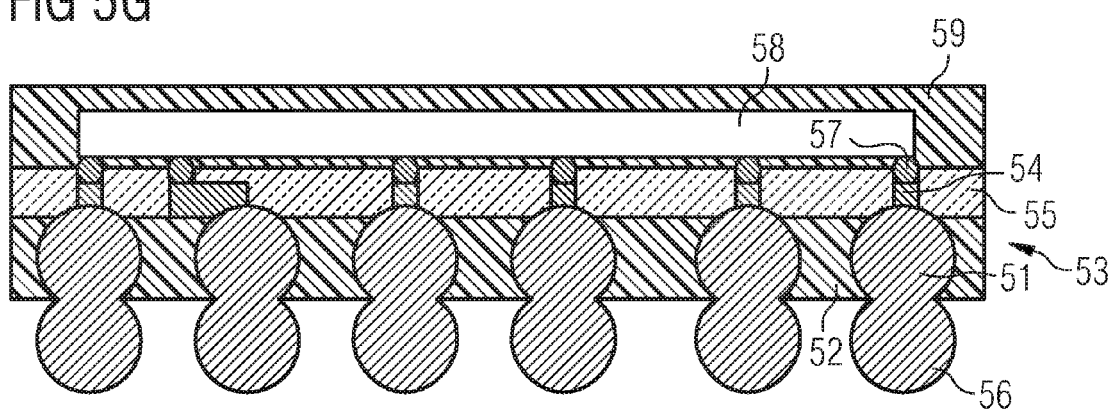

As shown in FIG. 5G, a circuit chip 58 is arranged on the carrier substrate 53 and connected to the contact layer 54 and to the through contacts 51 by means of solder connections 57, which may be arranged, at least in part, in openings of the solder mask 55. The solder connections 57 may have been formed by soldering solder balls, which may have been arranged on the top face of the carrier substrate 53 or on a bottom face of the circuit chip 58.

Furthermore, the circuit chip 58 may be encapsulated in a package 59. Solder balls 56 are arranged on the contact fields on the bottom face of the carrier substrate 53, the contact fields being formed by the exposed cross-section of the through contacts 51 of the carrier substrate 53. The solder balls 56 may comprise the same material as the material of the through contacts 51, or may comprise a solder metal, which may be melted and/or liquefied at a temperature at which the through contacts 51 still remain solid. In this way, the formation of reliable through contacts and electrical connections to the integrated circuit may be provided, since the through contacts 51 will be held solid and an expulsion of the material of the through contacts 51 is prevented.

In addition to this, the solder balls 56 may comprise the material of the through contacts 51 which may be simultaneously heated and/or liquefied. The arrangement of the integrated circuit in the vicinity of a respective circuit board with respective contact pads may prevent an expulsion of the material of the through contact 51 in such a case. Furthermore an aperture at a bottom side of the carrier substrate 53 in the area of the exposed cross-section of the through contacts 51 may be such that an expulsion of a liquefied material of the through contact 51 is suppressed, this by either shape and/or the size of such an aperture.

Figure 6A:
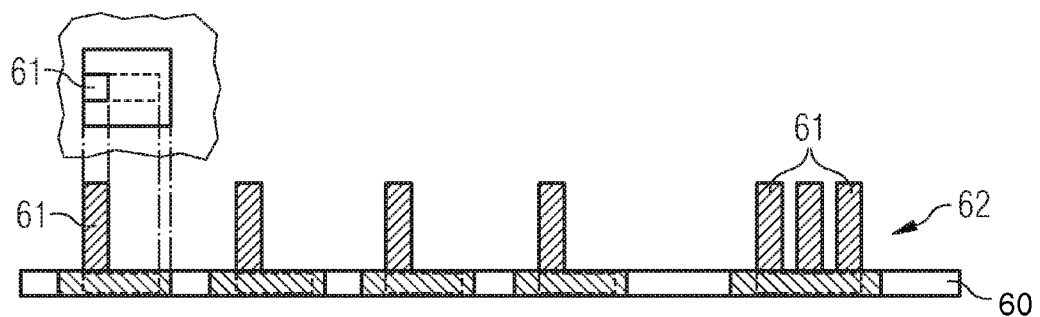
FIGS. 6A through 6D show schematic illustrations of an integrated circuit in various stages during manufacturing according to an embodiment of the present invention.

FIGS. 6A through 6D show an integrated circuit in various stages during manufacturing according to an embodiment of the present invention. As shown in FIG. 6A a lead frame 60 is provided. The lead frame 60 may comprise embossed structures such as beams 61 which may be folded upwards in order to provide vertical through contacts 61. Furthermore the lead frame 60 may comprise embossed structures such to provide a group 62 of vertical through contacts 61.

Figure 6B:
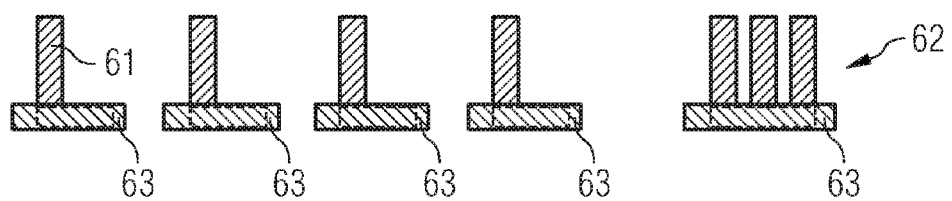

As shown in FIG. 6B individual units of the lead frame 60 are singularized, such to provide individual contact pads 63, being connected to through contacts 61. This may be effected on a base, such as a process carrier. Furthermore, the separation of the individual contact pads 63 may be effected by means of dicing or a wet etching process. The separation may be effected during this stage of manufacturing or after the provision of the substrate material 64 or after the contact layer 684 and/or the solder mask 67 have been provided on the top face of the carrier substrate 69.

Figure 6C:
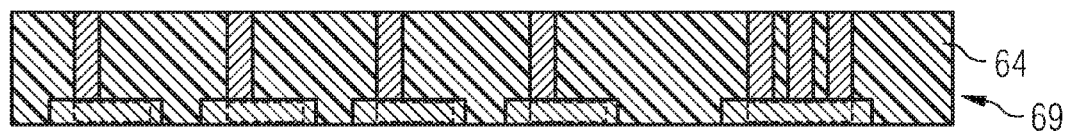

As shown in FIG. 6C, a substrate material 64 is provided around the individual units comprising the through contacts 61, such that the through contacts 61 are surrounded by the substrate material 64. The substrate material 64 is provided such that either the through contacts 61 are still accessible or even extend from the substrate material 62, or that the through contacts 61 are entirely covered by the substrate material 64. The substrate material 64 may be similar or identical to the substrate material 32, which has been described in conjunction with FIG. 3C. In the case, that the substrate material 64 entirely covers the through contacts 61, the substrate material 64 and/or the through contacts may be flattened from a top face, such to expose the through contacts 61.

Figure 6D:
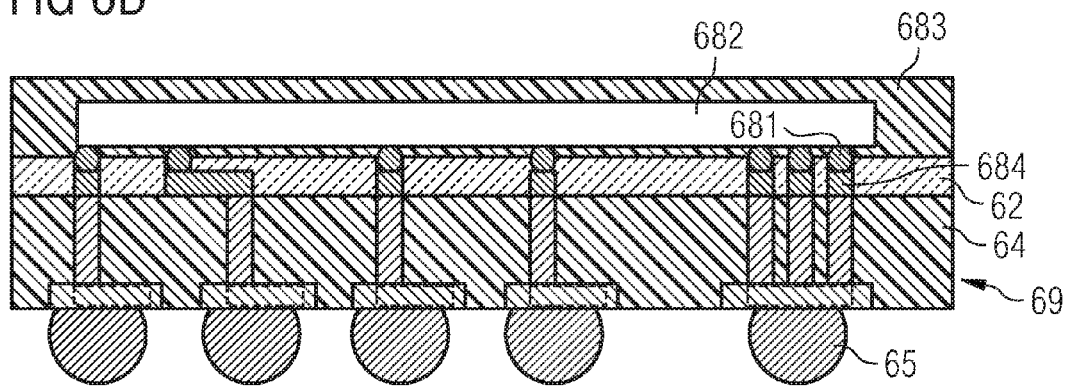

As shown in FIG. 6D, a circuit chip 682 is arranged on the carrier substrate 69 and connected to the contact layer 60 and to the through contacts 61 by means of solder connections 684. A solder mask 67 may be arranged between the circuit chip 682 and the contact layer 684 and the carrier substrate 69. The circuit chip 682 may further be encapsulated in a package 683. Solder balls 65 are arranged on the contact fields 63 on the bottom face of the carrier substrate 69, the contact fields 63 being formed by a part of the individual units of the lead frame 60.

Figure 7A:
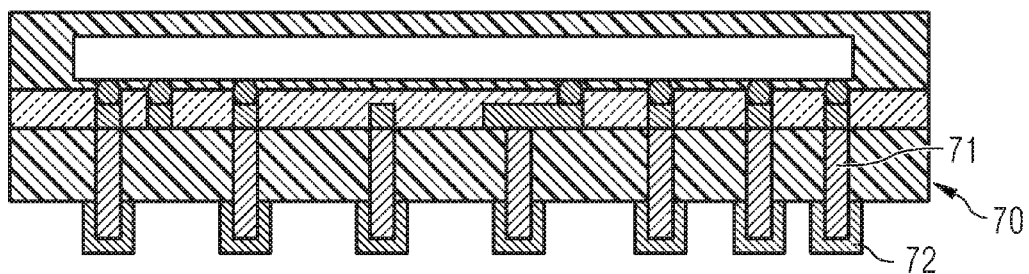
FIGS. 7A and 7B show a schematic illustrations of an integrated circuit and an integrated circuit in conjunction with a circuit board according to embodiments of the present invention.
Figure 7B:
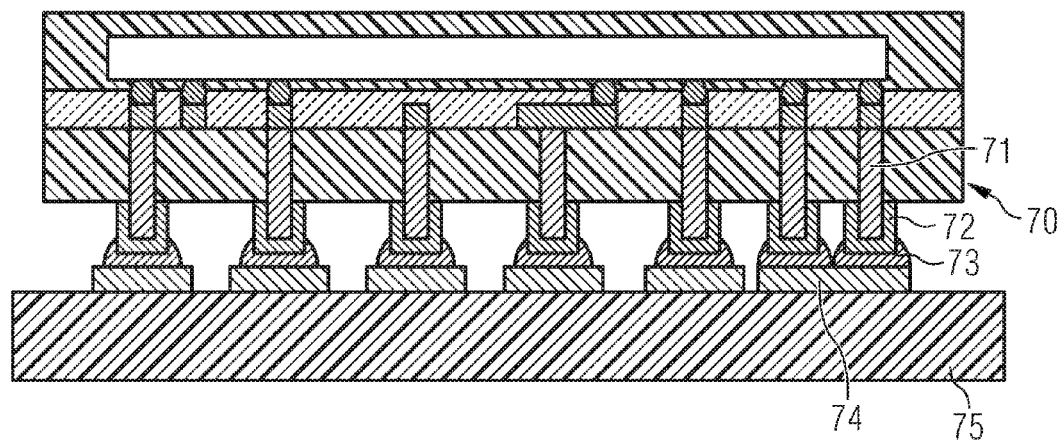

FIGS. 7A and 7B show an integrated circuit according to an embodiment of the present invention. As shown in FIG. 7A an integrated circuit 70 comprises through contacts 71 which extend from a bottom face of the integrated circuit 70. The integrated circuit 70 and/or the through contact 71 may be formed by means of an embodiment of the present invention. According to this embodiment, the extending ends of the through contact 71 are covered by a coating 72. The coating 72 may comprise an elastic material, such as elastic brass, nickel, cobalt, palladium, colophony, urea, zinc chloride, a solder metal and/or the like.

Accordingly, the mechanical properties of the extending ends of the through contact 71 may be such that the integrated circuit 70 may be handled and/or connected to an external circuitry as it is. The mechanical properties may be such that the extending ends are less prone to a mechanical deflection, and therefore, the integrated circuit 70 may be soldered directly to a circuit board 75, as shown in FIG. 7B. The circuit board 75 comprises contact pads 74 at corresponding positions of the through contacts 71. The extending ends of the through contact 71 with the coating 72 are connected to the contact pads 74 by solder connections 73.

Figure 8A:
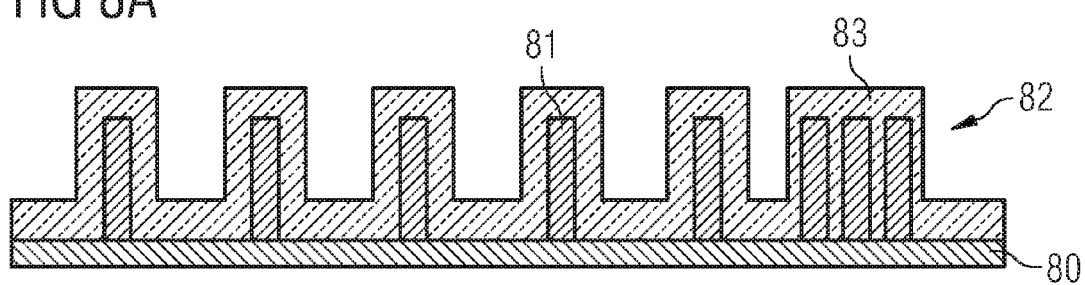
FIGS. 8A and 8B show schematic illustrations of an integrated circuit in stages during manufacturing according to an embodiment of the present invention.
Figure 8B:
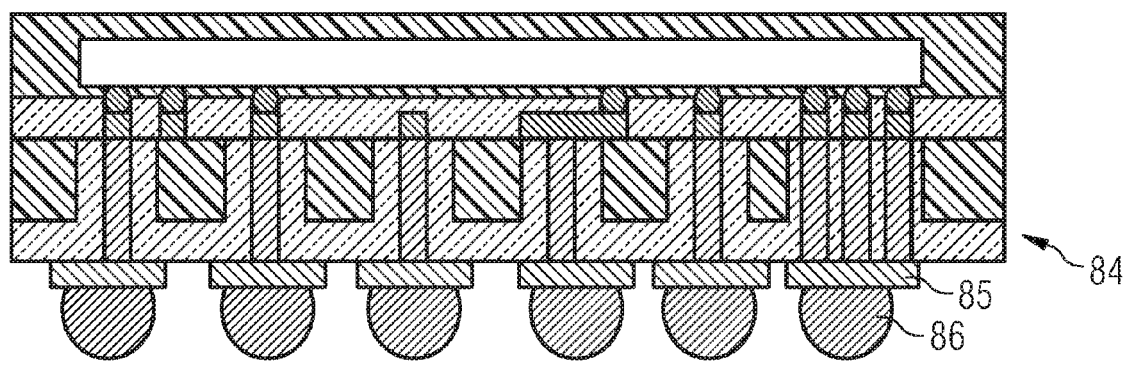

FIG. 8A and 8B show an integrated circuit in two stages during manufacturing according to an embodiment of the present invention. As FIG. 8A shows, a base 80 and through contacts 81 are provided. The base 80 may be or comprise a base layer, a contact layer, and/or a process carrier, such as the contact layers 30, 40, 60 or the base layer 50 as they have been described in conjunction with an embodiment of the present invention. The through contacts 81 may be or comprise a through contact, such as the through contacts 31, 41, 51, or 61 as they have been also described in conjunction with an embodiment of the present invention.

According to this embodiment of the present invention, the through contacts 81 are coated with a material 83, such as a dielectric coating. The material 83 may be a dielectric material, providing a well defined insulation and/or dielectric constant. The through contacts 81 may be covered individually, and/or groups 82 of through contacts 81 may be covered collectively by the material 83. The coating of the material 83 may be effected by means of deposition and/or electroless plating techniques, and may provide an improved insulation, an improved mechanical stability, improved solder properties, improved dielectric properties, an improved and/or matched impedance, and/or an improved transmittance for ac-signals. The coating may further enable a control of a parasitic capacitance of the through contacts 81. Suitable materials of the material 83 include parylene, which may be deposited by means of a chemical vapor deposition (CVD). A layer thickness of the coating may be in a range of 0.1 µm to 5 µm.

As shown in FIG. 8B, a ready integrated circuit 84 comprises a carrier substrate with through contacts 81 which are coated and surrounded by the material 83. The integrated circuit 84 may further comprise contact pods 85 and solder balls 86 for an interconnection to further circuitry, such as a circuit system, computer system, memory system, or printed circuit board. The provision of the material 83 may provide an integrated circuit 84 with improved signal transmittance properties and an improved performance.

Figure 9A:
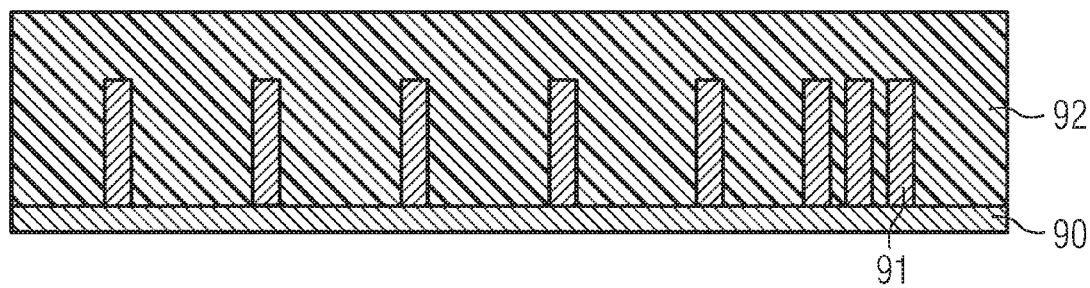
FIGS. 9A through 9C show schematic illustrations of an integrated circuit in various stages during manufacturing according to an embodiment of the present invention.
Figure 9B:
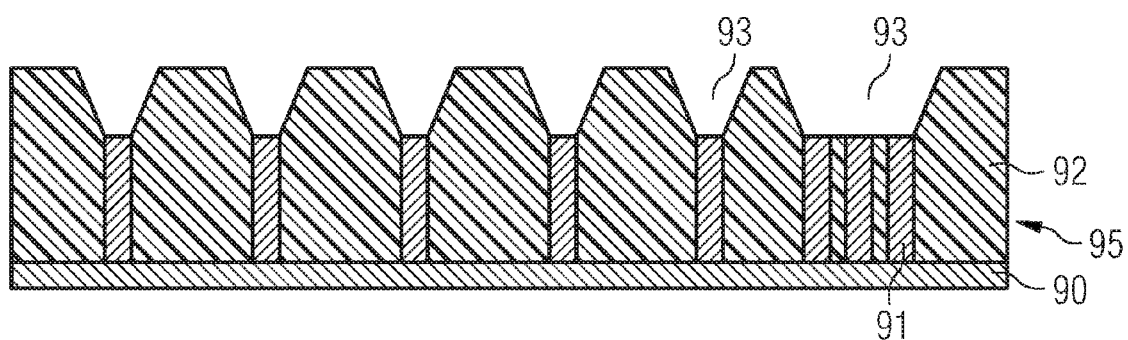
Figure 9C:
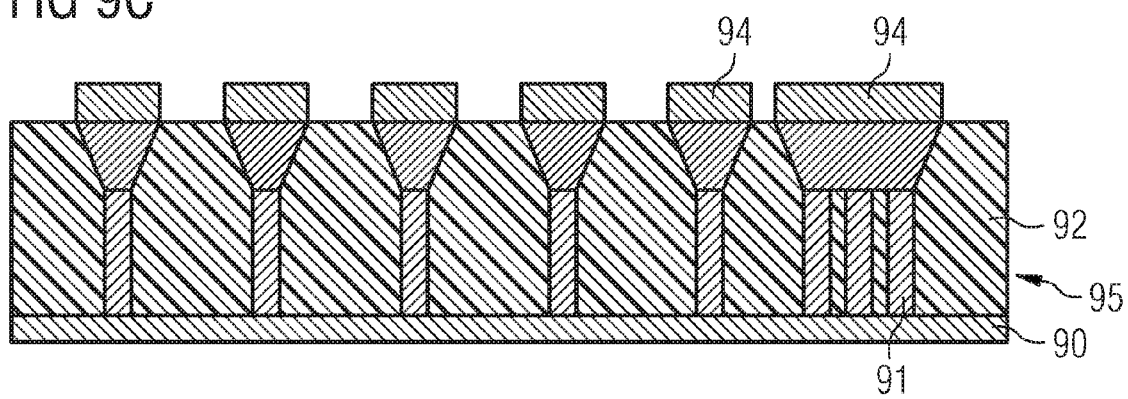

FIGS. 9A through 9C show schematic views of an integrated circuit in various stages during manufacturing according to an embodiment of the present invention. As FIG. 4A shows, a first contact layer 90, through contacts 91, and a substrate material 91 are provided according to an embodiment of the present invention. The first contact layer 90, the through contacts 91, and the substrate material 92 may be similar or identical to the first contact layer 30, the through contacts 31, and the substrate material 32, respectively, which have been described in conjunction with FIGS. 3A through 3H. The substrate material 92 is accordingly provided, such that it covers the through contacts 91.

As shown in FIG. 9B, a part of the substrate material 92 above through contacts 91 is removed in order to expose the through contact 91. This may be effected by means of laser opening, anisotropic etching, wet etching, and/or optically enhanced etching. The removal of the substrate material 92 forms apertures 93 in an area above the through contacts 91.

As shown in FIG. 9C, the apertures 93 have been filled with a conductive material such to form contact pads 94, and such to contact the through contacts 91 of the carrier substrate 95. The carrier substrate 95 may subsequently subject to further processing as is described in conjunction with an embodiment of the present invention. For example, the contact layer 90 may be structured in order to form contact pads, and further contact layers and/or solder masks may be provided prior to a formation of an integrated circuit, comprising he carrier substrate 95, a circuit chip, and/or a package.

Figure 10A:
FIGS. 10A through 10D show schematic illustrations of an integrated circuit in various stages during manufacturing according to an embodiment of the present invention.

FIGS. 10A through 10D show an integrated circuit in various stages during manufacturing according to an embodiment of the present invention. As FIG. 10A shows, a first contact layer 1300 is provided. The first contact layer 1300 may be similar or identical to the first contact layer 30 or the first contact layer 40, which have been described in conjunction with FIGS. 3A through 3H and/or FIGS. 4A through 4F.

Figure 10B:
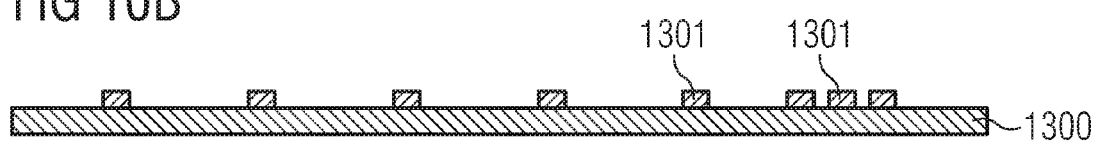

As shown in FIG. 10B, a metallization 1301 is provided on the first contact layer 1300. This metallization 1301 may be provided by means of depositing a metal layer and a subsequent structuring of the metal layer, such to form the pads and the group of pads of the metallization 1301.

Figure 10C:
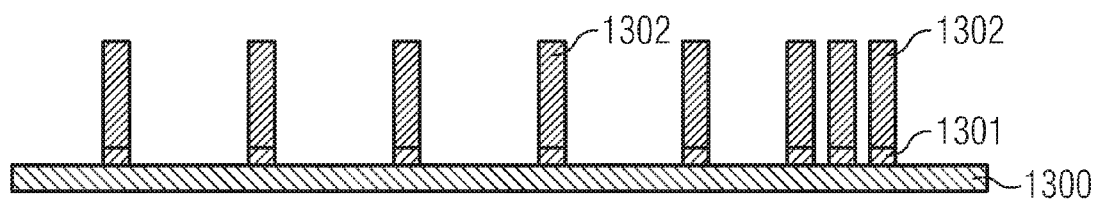
Figure 10D:
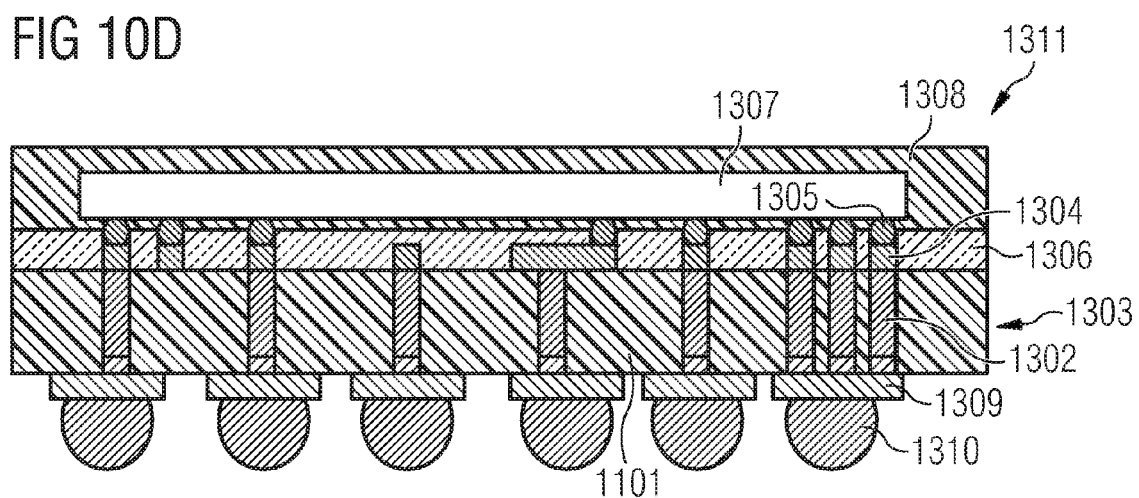

As shown in FIG. 10C, through contacts 1302 are provided on the defined pads of the metallization 1301. According to this embodiment, the through contacts 1302 may comprise carbon nanotubes (CNT). The CNTs may be single walled or multi-walled CNTs, and may provide a metallic and/or a semiconducting conductivity, and may comprise a dopant. The through contacts 1301 may further comprise a bunch of CNTs and/or aligned carbon nanotubes (ACNT), such to provide a reliable and reproducible through contact 1302 during further processing and/or operation.

The CNTs may be provided by a growing and/or depositing technique, such as a chemical vapor deposition (CVD) technique. During such a deposition, the CNTs of the through contacts 1302 may be formed exclusively or predominantly on the pads of the metallization 1301. A process temperature during such a provision may be above 300° C., above 400° C., or above 500° C. The provision of the through contacts 1302 at such elevated temperatures may furthermore be conducted prior to a provision of thermally sensitive elements or elements that possess a restricted thermal budget, such as semiconductor substrates and/or circuit chips.

As shown in FIG. 6D, an integrated circuit 1311 comprises a carrier substrate 1303, which, in turn, comprises the through contacts 1302. The carrier substrate 1303 may be formed according to an embodiment of the present invention, comprising the substrate material 1101. The integrated circuit 1311 further comprises a circuit chip 1307, which may be coupled to the through contacts 1302 by means of a second contact layer 1304 and connections 1305. A solder mask 1306 may be arranged between the circuit chip 1307 and the carrier substrate 1303. The integrated circuit 1311 may furthermore comprise a package 1308 and/or solder balls 1310 on contact pads 1309.

The second contact layer 1304, the connections 1305, the solder mask 1306, the circuit chip 1307, the package 1308, the contact pads 1309, and/or the solder balls 1310 may be similar or identical to the respective elements as they have been described in conjunction with an embodiment of the present invention.

The preceding description only describes exemplary embodiments of the invention. The features disclosed therein and the claims and the drawings can, therefore, be important for the realization of the invention in its various embodiments, both individually and in any combination. While the foregoing is directed to embodiments of the present invention, other and further embodiments of this invention may be devised without departing from the scope of the invention, the scope of the invention being determined by the claims that follow.

What is claimed is:

1. A method of manufacturing an integrated circuit, comprising:
   forming a carrier layer comprising a base layer;
   forming through contacts over the base layer;
   thereafter, forming a substrate material in a region between adjacent through contacts; and
   thereafter, patterning the base layer to provide through contact pads defined by portions of the base layer.

2. The method of claim 1, wherein forming the through contacts comprises forming a bond wire.

3. The method of claim 1, wherein forming the through contacts comprises forming any one of a solder ball, a sphere, a pillar, a stud, and a grain.

4. The method of claim 1, wherein forming the through contacts comprises forming a lead frame.

5. The method of claim 1, wherein forming the through contacts comprises forming carbon nanotubes.

6. The method of claim 5, wherein forming the through contacts comprises forming a metallization pad and a chemical vapour deposition of the carbon nanotubes on the area of the metallization pad.

7. The method of claim 1, wherein forming the substrate material comprises:
   casting the substrate material in a viscous state; and
   solidifying the substrate material.

8. The method of claim 1, wherein the substrate material is not formed in a region between upper portions of the through contacts.

9. The method of claim 1, further comprising removing an upper portion of the substrate material so that an upper portion of the through contacts is uncovered.

10. The method of claim 1, further comprising removing a portion of the substrate material between upper portions of the through contacts.

11. An integrated circuit that is manufacturable by the method of claim 1.

12. An integrated circuit comprising:
   a carrier layer, the carrier layer comprising:
      through contacts protruding from a base layer;
      a substrate material introduced into a region between adjacent through contacts leaving a respective portion of the through contacts protruding above the substrate material, wherein the base layer is patterned into through contact pads; and
      a connective material disposed on the respective protruding portion of the through contacts, wherein at least some of the connective material is disposed between adjacent through contacts.

13. The integrated circuit of claim 12, wherein at least one through contact comprises a wire.

14. The integrated circuit of claim 12, wherein the carrier layer further comprises any functional unit selected from the group of a capacitor, an inductor, a resistor, a diode, a fuse, a filter, and a transistor, the functional unit being coupled to the through contact.

15. The integrated circuit of claim 12, further comprising:
 a circuit chip comprising a second contact field; and
 a connection, the connection coupling the second contact field of the circuit chip to the connective material.

16. The integrated circuit of claim 15, further comprising another circuit chip arranged on the circuit chip.

17. The integrated circuit of claim 15, wherein each through contact pad is coupled to a respective through contact.

18. The integrated circuit of claim 17, further comprising a solder ball being arranged on at least one of the through contact pads.

19. The integrated circuit of claim 15, further comprising a solder ball, the solder ball being coupled to at least one of the through contact pads.

* * * * *